United States Patent [19]

Boudewijns

[11] Patent Number: 5,012,143

[45] Date of Patent: Apr. 30, 1991

[54] INTEGRATED DELAY LINE

[75] Inventor: Arnoldus J. J. Boudewijns, Eindhoven, Netherlands

[73] Assignee: U.S. Philips Corp., New York, N.Y.

[21] Appl. No.: 417,976

[22] Filed: Oct. 4, 1989

[30] Foreign Application Priority Data

Feb. 15, 1989 [NL] Netherlands .......................... 8900363

[51] Int. Cl.⁵ ..................... H03K 17/16; H03K 17/693
[52] U.S. Cl. .................................... 307/606; 307/594; 307/246; 377/75
[58] Field of Search ............... 307/246, 596, 606, 602; 377/75

[56] References Cited

U.S. PATENT DOCUMENTS

| | | | |
|---|---|---|---|
| 3,986,176 | 10/1976 | Weimer | 307/607 |
| 4,714,924 | 12/1987 | Ketzler | 307/602 |
| 4,914,319 | 4/1990 | Hashimoto | 307/246 |

*Primary Examiner*—Timothy P. Callahan
*Attorney, Agent, or Firm*—Steven R. Biren

[57] ABSTRACT

A delay line, especially for delaying t.v. signals, includes a series of signal storage capacitances, an input line, an output line, selection transistors between the storage capacitances and the input and output lines and a digital shift register for activating the selection transistors. According to the invention, the output line comprises a central part, on either side of which signal storage capacitances with associated selection transistors are located, which in turn are located between the central part of the output line and the associated parts of the shift register. The design according to the invention results in a compact configuration, which has the advantage that the parasitic capacitance of the output line is comparatively low. The configuration can be readily extended to two interlaced delay lines having a single common shift register.

4 Claims, 6 Drawing Sheets

INTEGRATED DELAY LINE

BACKGROUND OF THE INVENTION

The invention relates to an integrated circuit having a delay line arranged at a surface of a semiconductor body and comprising a series of signal storage capacitances, an input line for supplying signals and a read-out line for reading out the stored signals, a series of pairs of transistors, which are each associated with a signal storage capacitance and of which a transistor, the read-in transistor, constitutes a switch between the capacitance and the read-in line, while the other transistor, the read-out transistor, constitutes a switch between the capacitance and the read-out line, and further comprising a digital shift register having a number of outputs which are connected to control electrodes of the transistors.

Such an arrangement, which may be used inter alia for processing video signals, for example t.v. signals, is known from the article "Signalverarbeitung mit analogen Speichern in der Fernsehtechnik" of G. Brand, published in "Fernish- und Kinotechnik", Vol. 30, No. 3 (1976), pp. 81-85. FIG. 5b of this publication shows diagrammatically a delay line, in which the storage capacitances together with the associated pairs of transistors and the shift register are consecutively arranged in a linear configuration. The signals to be stored are supplied via the input line. By means of the shift register and the read-in transistors controlled by the shift register, the signal storage capacitances are successively connected to the input line. When the signal has been stored, the connection between the input line and the capacitances is interrupted again, as a result of which the signal value supplied at the input line remains present at the capacitance for a desired delay time. When reading out, the read-out transistors are successively rendered conducting by the shift register, as a result of which the stored signals appear successively at the read-out line and can be read out via an amplifier.

The value of the (voltage) signal at the read-out line is determined in analogy with dynamic memories by the ratio between the signal storage capacitance and the parasitic capacitance of the read-out line. Because of the disturbance margins to be taken into account, it is desirable that the difference between the highest value and the lowest value of the signals be as great as possible. For this reason, the parasitic capacitance of the read-out line is kept as small as possible.

SUMMARY OF THE INVENTION

An object of the invention is to design the circuit so that a low parasitic capacitance of the read-out line is obtained.

In the known circuit, as shown in FIG. 5b of the aforementioned publication, two parallel delay lines are arranged, which are each controlled by a separate shift register. In general, these shift registers occupy a fairly large amount of space in the silicon crystal. A further object of the invention is therefore to design the circuit so that is possible, in case of two delay lines, to use only one shift register.

An integrated circuit according to the invention is characterized in that the delay line comprises at least two adjacent parts with a common centrally arranged part of the read-out line, viewed on the surface, on either side of which the signal storage capacitances and the associated pairs of transistors and parts of the shift register are located, in such a manne thatr on either side of the said part of the read-out line signal storage capacitances with the associated pairs of transistors of one of the parts of the delay line are located between the read-out line and the associated part of the shift register.

When signal storage capacitances are provided on either side of the said central part of the read-out line, a reduction of the length of the read-out line and hence a reduction of the parasitic capacitance is obtained as compared with the situation in which the memory cells are all consecutively arranged.

An important embodiment is characterized in that two read-out transistors located on either side of the centrally arranged port of the read-out line are connected via a common contact to the centrally arranged part of the read-out line. Due to the fact that the memory cells located on either side have common contacts, the number of contacts in this part of the delay line is halved, as a result of which is considerably reduction of the parasitic capacitance is obtained.

A further embodiment, which has the advantage that only one shift register is required for two delay lines, is characterized in that besides the first said delay line a second delay line is present, whose construction is analogous to that of the first delay line and which also comprises at least two parts, which are arranged on either side of the two parts of the first delay line, the said parts of the shift register being common to the first and second delay lines.

BRIEF DESCRIPTION OF THE DRAWINGS

The invention will be described more fully with reference to several embodiments and the accompanying diagrammatic drawing, in which.

DESCRIPTION OF THE PREFERRED EMBODIMENTS

Figure 1:
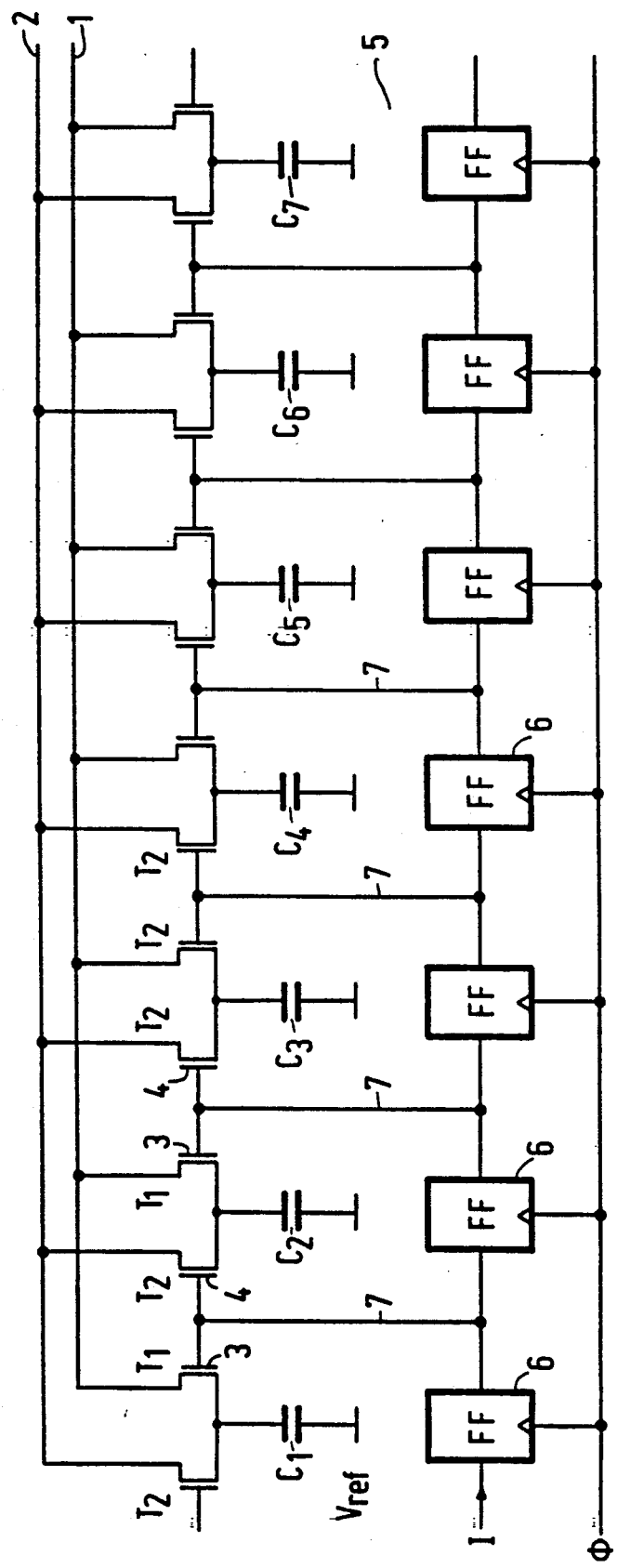
FIG. 1 shows the block circuit diagram of a delay line of the type to which the invention relates.

The delay line shown in FIG. 1 is known in principle from FIG. 5b of the aforementioned publication. The information is stored on the upper plate (electrode) of the capacitance $C_1$, $C_2$, $C_3$ etc., whose lower plate is applied to a reference voltage. The information is supplied via the input line 1 and is read out via the output line 2. The information-containing plates of the capacitors $C_1$, $C_2$, $C_3$ etc. are connected for this purpose via a switch $T_1$ to the input line and via the switch $T_2$ to the output line. The switches $T_1$ and $T_2$ are constituted by MOS transistors, whose source and drain electrodes constitute a current path between the information-containing capacitance electrodes on the one hand and the lines 1 and 2 on the other hand. The transistors $T_1$ and $T_2$ will be designated hereinafter as read-in transistor and read-out transistor, respectively. The gate electrodes $\frac{1}{4}$ of the transistor $T_1/T_2$ are controlled by a shift register 5, via which a signal is transported from the left to the right and the transistor $T_1$, $T_2$ are sequentially rendered conducting and non-conducting through the connections 7. The transport of the signal I is controlled by one or more clocks $\phi$. The shift register may be constructed in known manner as a circuit of dynamic flip-flops 6. As will appear further from FIG. 1, each time a read-in transistor $T_1$ of a first group and the read-out transistor $T_2$ of the next group of two transistors are connected to a common output 7 of the shift register, as a result of which a memory cell is first read out (reset) and is then written again with the same signal I at the connection 7, the information on the capacitor remaining stored until a new pulse I passes the connection 7. As a matter of course, other connections are also possible. For the operation of the circuit, reference is made to the aforementioned publication.

Figure 2:
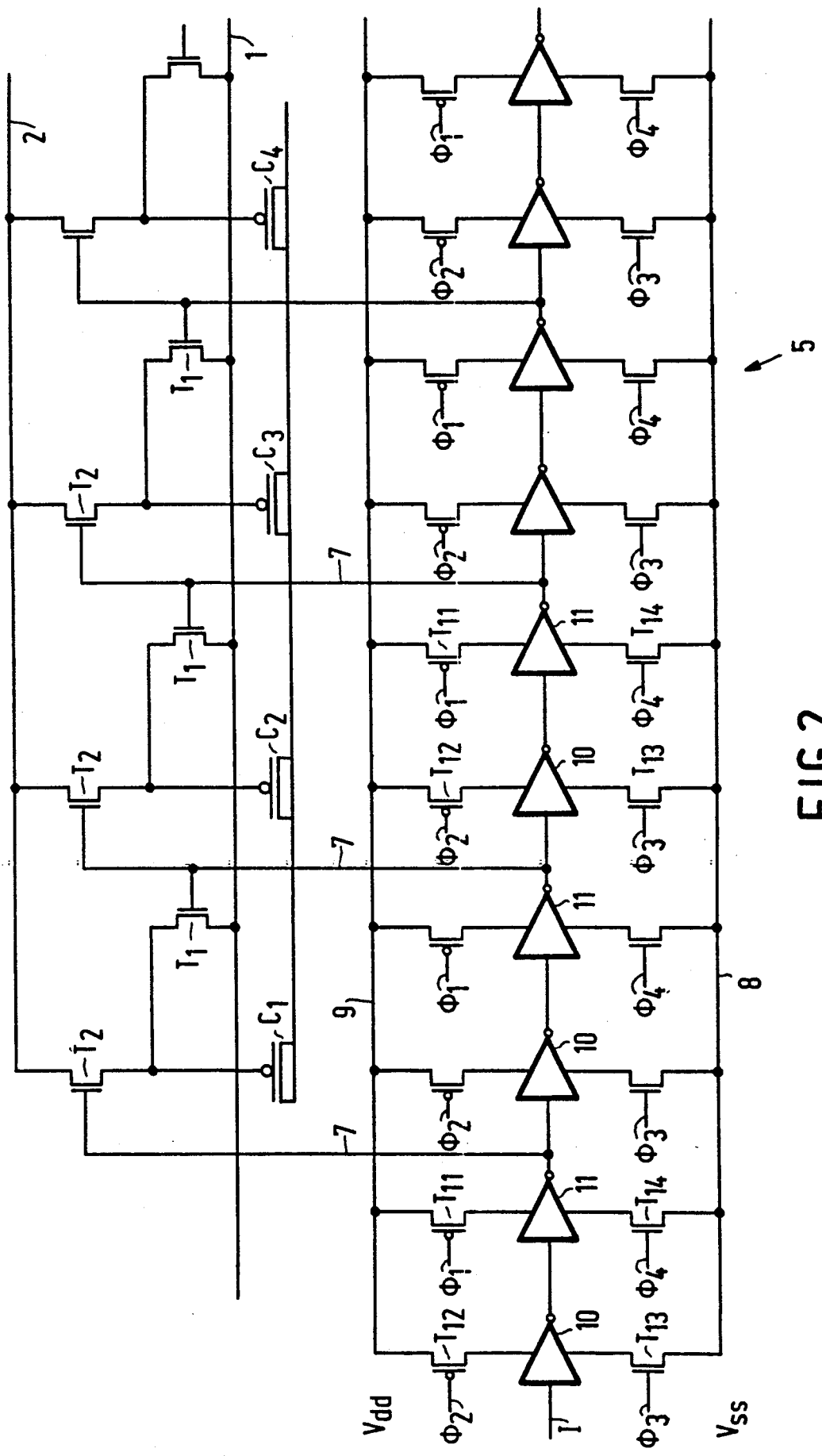
FIG. 2 shows the electric circuit diagram of an embodiment of this delay line.

FIG. 2 shows in greater detail an embodiment of the circuit of FIG. 1. The transistors $T_1$ and $T_2$ are constituted by n-channel transistors, while the capacitances $C_1$ are constituted by p-channel transistors, whose source and drain electrodes are short-circuited and constitute the plate of the capacitor applied to the reference voltage, while the gate electrodes constitute the other plate containing the information. It should be noted that in the circuit diagram shown in FIG. 2 the p-channel transistors are distinguished by a ring on the gate electrodes from the n-channel transistors.

Figure 3:
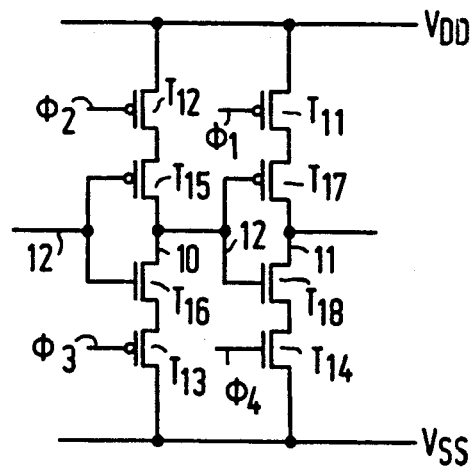
FIG. 3 shows the circuit diagram of a stage of the shift register of the arrangement shown in FIG. 1.

The shift register 5 is composed of a number of stages, which are controlled by four clocks $\phi_1$, $\phi_2$, $\phi_3$ and $\phi_4$. Each substage comprises four transistors controlled by the clocks $\phi_1$, i.e. the p-type channel transistors $T_{11}$ and $T_{12}$, to whose gates the clocks $\phi_1$ and $\phi_2$, respectively, are applied and the n-channel transistors $T_{13}$ and $T_{14}$, to whose gates the clocks $\phi_3$ and $\phi_4$, respectively, are applied. The source electrodes of the n-channel transistors $T_{13}$ and $T_{14}$ are connected to the negative supply line 8, to which the supply voltage $V_{ss}$ is applied; the source electrodes of the p-channel transistors are connected through the positive supply line 9 to the voltage $V_{dd}$. Between the transistors $T_{12}/T_{13}$ and the transistors $T_{11}/T_{14}$, inverter stages 10 and 11, respectively, are arranged, which are interconnected in a sequence. The input signal is supplied to the inverter stage on the left-hand side of the drawing and is transported to the right in a manner controlled by the clock voltages $\phi_1$, $\phi_2$, $\phi_3$ and $\phi_4$. Each inverter stage 10, 11 may consist, as shown in FIG. 3, of a CMOS inverter. The inverter stage 10 comprises the p-channel transistor $T_{15}$ and the n-channel transistor $T_{16}$; the inverter stage 11 comprises the p-channel transistor $T_{17}$ and the n-channel transistor $T_{18}$. The inputs of the inverters are constituted by the common gate connections and the outputs are constituted by the junction point 13 of the drain of $T_{15}/T_{17}$ and the drain of the n-channel transistors $T_{16}/T_{18}$.

When reading out the stored information, the charge is transferred entirely or in part to the read-out line (bit line) 2. The value of the signal depends upon the value of the parasitic read-out capacitance. In order to obtain the largest possible output signal, it is desirable to design the delay line so that the parasitic capacitance is as low as possible.

Figure 4:
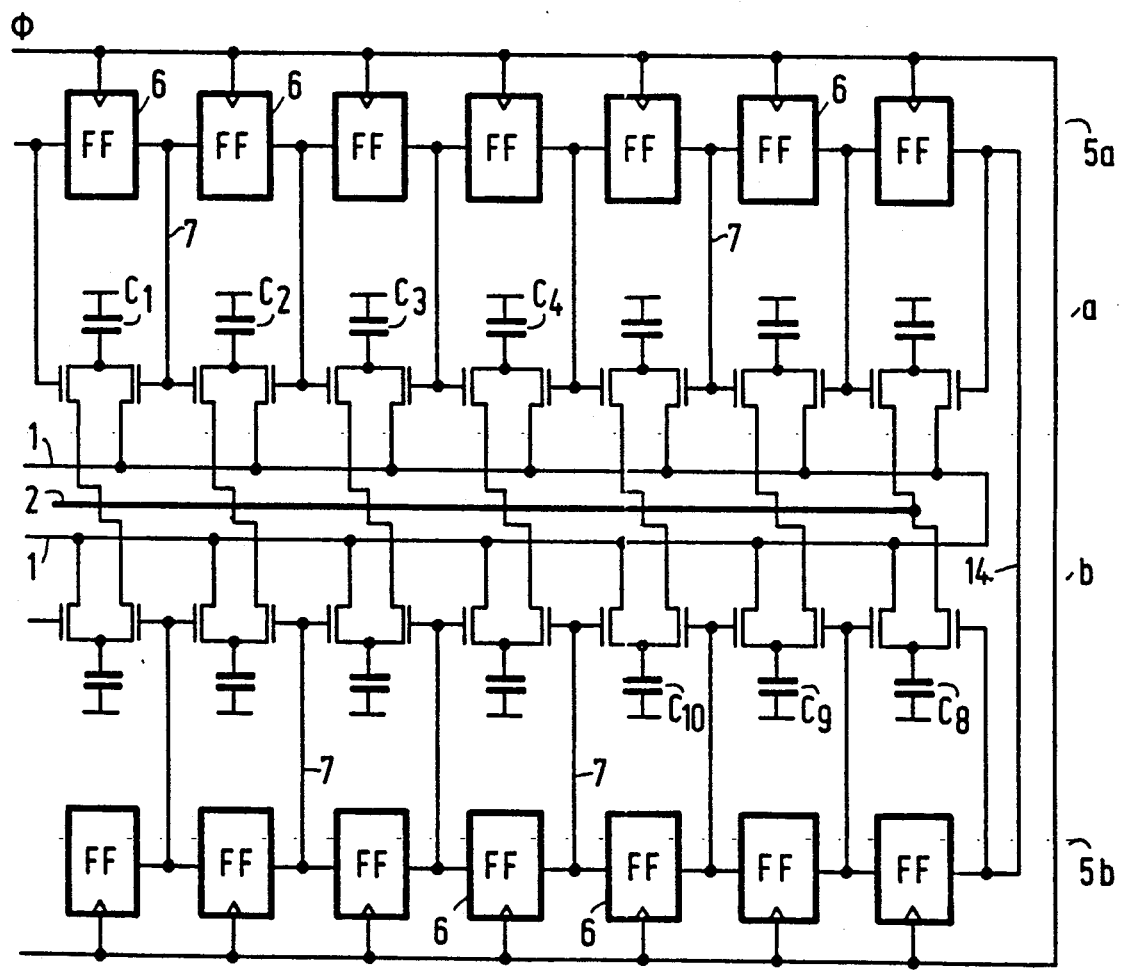
FIG. 4 shows diagrammatically in plan view the design of a delay line according to the invention.

FIG. 4 shows the design (lay-out) diagram of an embodiment, in which the length of the read-out line is considerably smaller than the length of the shift register 5. As a result, a considerable reduction of the parasitic bit line capacitance is obtained as compared with embodiments in which the bit line length is comparable with the length of the shift register 5. In FIG. 4, the same reference numerals are used for corresponding parts as in FIGS. 1-3. The sequence of capacitances $C_1$, $C_2$, $C_3$ etc. with the associated read-in and read-out transistors $T_1/T_2$ comprises at least two subrows a and b, which are located beside each other and extend, viewed on the surface, parallel to each other and beside each other. The read-out line 2 (or at least a part thereof) is arranged centrally between the subrows a and b and the capacitances $C_1$ of the subrows a and b and the associated read-in and read-out transistors $T_1$ and $T_2$ are located on either side of said line. The associated parts 5a and 5b of the shift register 5 are located on the side of the subrows a and b remote from the central part of the read-out line 2 in such a manner that the capacitances $C_1$ with the associated read-in and read-out transistors $T_1/T_2$ are located between the central part 2 of the bit line and the associated parts of the shift register 5a/5b. The parts 5a and 5b of the shift register are serially interconnected through a connection 14. The input line 1 can be arranged, as shown in FIG. 4, to surround the central part 2 of the bit line in the form of a U.

As is apparent from FIG. 4, the length of the part of the bit line 2 in the part shown of the delay line is about only half that of the read-in line and/or the shift register, as a result of which the considerable reduction of the bit line capacitance is obtained. A further reduction can be obtained, as shown diagrammatically in FIG. 4, in that the read-out transistors $T_2$ located on either side of the bit line 2 are connected pairwise through a common contact to the bit line.

Figure 5:
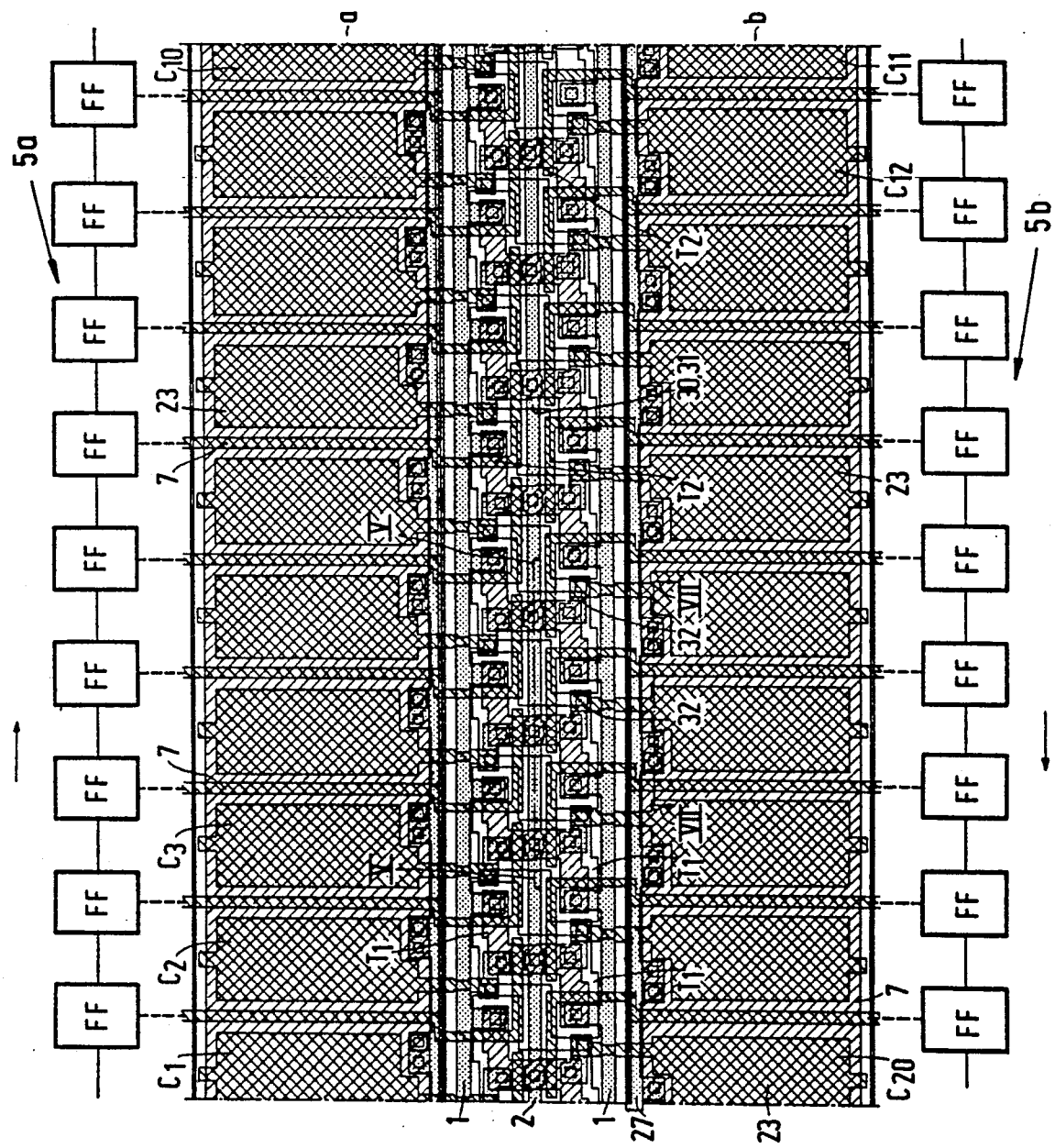
FIG. 5 shows in plan view a part of a first embodiment of such a delay line according to the invention.

FIG. 5 shows in plan view a part of a detailed embodiment. The Figure shows twenty memory capacitances $C_1$ entirely or in part, grouped in two parallel subrows a and b. The associated stages of the shift register 5 are shown only diagrammatically. The arrangement is manufactured according to the CMOS technology with a polycrystalline silicon layer and an aluminum layer. The silicon body is a p-type substrate, which is provided on behalf of the p-channel transistors with weakly doped n-doped surface regions (wells), in which the p-channel transistors, such as the capacitances $C_1$, are formed.

Figure 7:
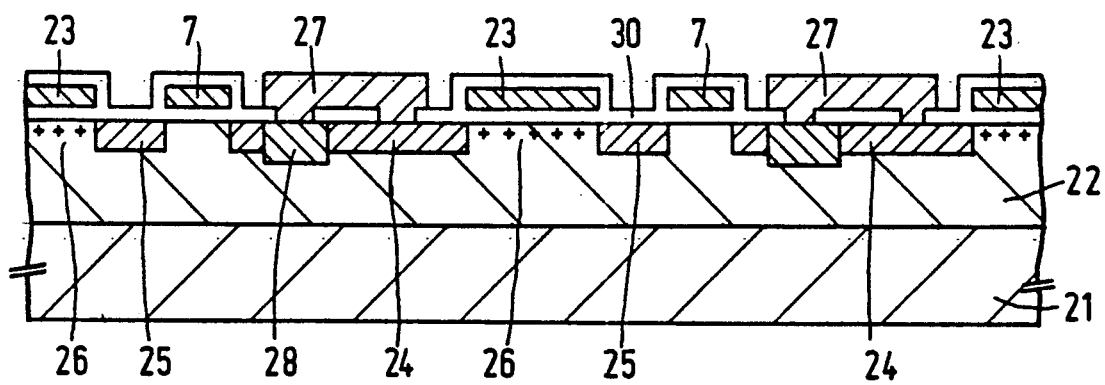
FIG. 7 is a sectional view taken on the line VII—VII in FIG. 5.

FIG. 7 is a sectional view at the area of the capacitances $C_1$ taken on the line VII—VII in FIG. 5. In this Figure, the p-type substrate 21 is indicated, which is provided with the weakly doped p-zone (well) 22. The capacitance electrodes on which the information-representing charge is stored are constituted by the polycrystalline silicon surfaces 23 (poly), which are separated by the thin gate dielectric 20 of, for example, silicon oxide from the subjacent semiconductor body. The connections 7 between the shift register 5 and the read-in and read-out transistors $T_1/T_2$ are present between the poly electrodes 23. The connections 7 are also made of poly. In the n-type region 22, p-type zones 24 and 25, which constitute the source and drain zones of the transistors constituting the capacitances (cf. FIG. 2), are formed in a self-registered manner with respect to the poly layers 23 and 7. During operation, these zones are shortcircuited by means of an inversion channel 26 under the electrodes 23, which can be obtained in that the source zones are applied to a positive voltage, for example $V_{dd}$. This voltage is supplied via an Al line 27 (cf. FIGS. 5 and 7), which is connected through contact openings in the oxide layer 20 to the p-zones 24. The n-type region is shortcircuited with the p-type zones 24 by line 27, which is connected through further contact windows in the oxide layer 20 and the subjacent n-type surface zones 28 to the n-type region 22.

It should be noted that in the present embodiment only the p-type zones 24 are connected to the Al line 27. However, the p-type zones 25 may also advantageously be connected through an additional contact window to the Al line. It should further be noted that the parts in FIG. 5 which are cross-hatched represent the active surface regions of the semiconductor body, while the other non-cross-hatched parts represent the regions of the semiconductor body which are covered by thick field oxide.

Figure 6:
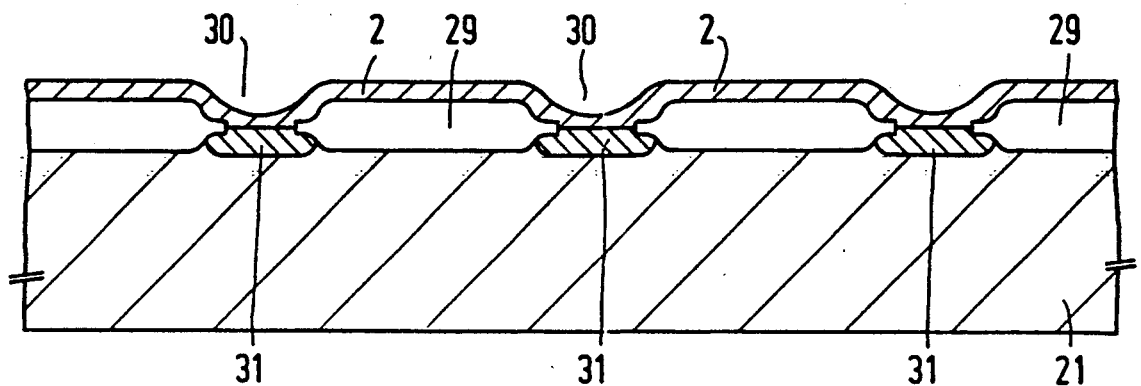
FIG. 6 is a sectional view taken on the line VI—VI in FIG. 5.

FIG. 6 shows a cross-section of the arrangement along a part of the read-out line 2 taken on the line VI—VI in FIG. 5. The surface of the semiconductor body 21 under the read-out line 2 is practically entirely covered with thick fiedl oxide 29. At the area of the contacts, the oxide layer 29 has openings 30, at which n-type zones 31 extend at the surface of the semiconductor body 21, which are connected through openings in the oxide layer to the read-out line 2. The zones 31 each constitute a common zone (electrode) of the read-out transistor located on either side of the read-out line 2. The number of contacts (with the contact windows and zones 31) is thus only half the number of memory elements, as a result of which a considerable reduction of the capacitance of the read-out line is obtained.

In the plan view of FIG. 5, the read-out in line 1 (which like the read-out line 2 is made of Al) is represented on either side of the read-out line 2. Via the read-in transistor $T_1$, the read-in line 1 is connected to the poly electrodes 23, which are connected at the area of the contacts 32 to the read-in transistors $T_1$.

Figure 8:
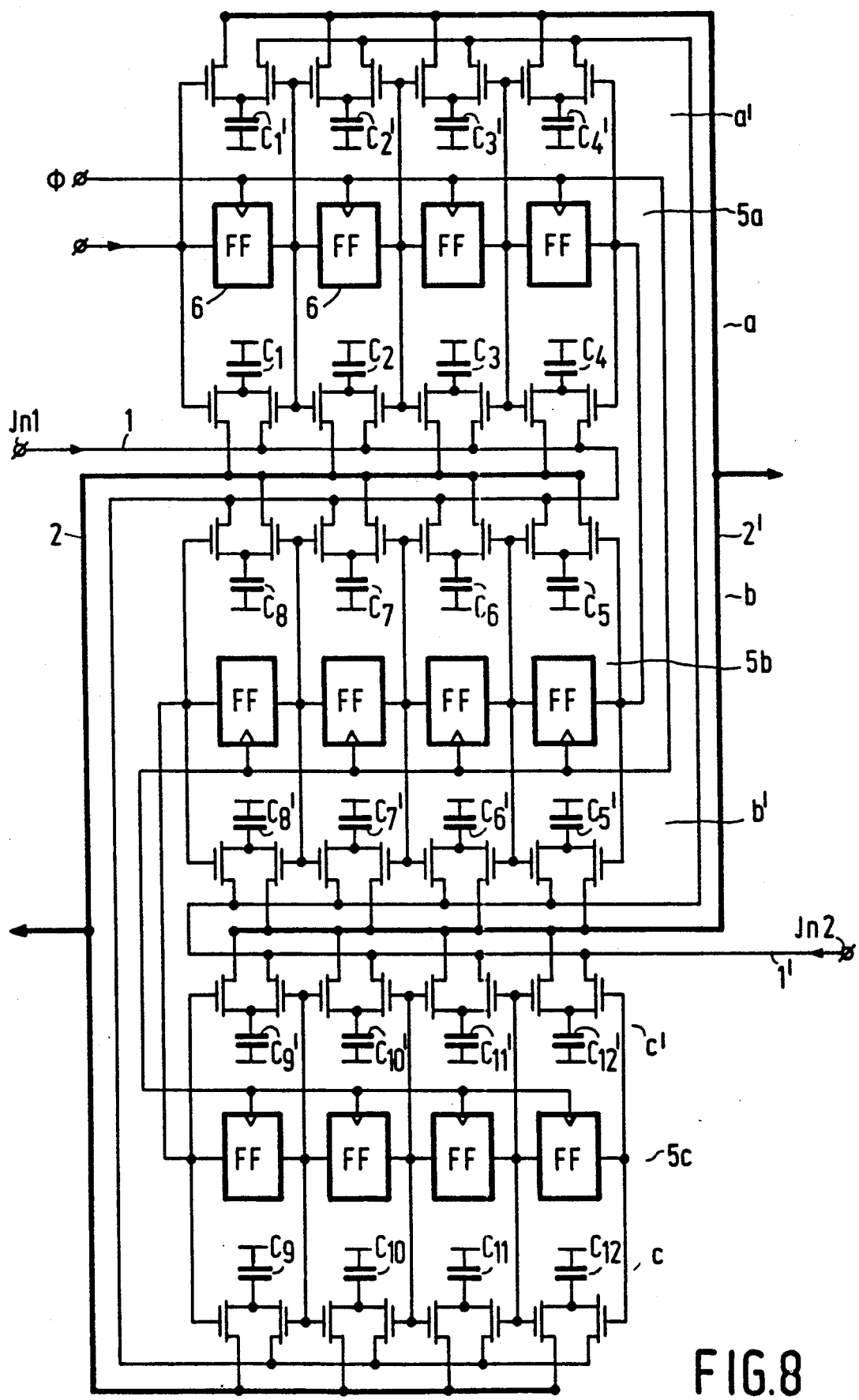
FIG. 8 shows diagrammatically the design of a second embodiment of a delay line according to the invention.

FIG. 8 shows in the same manner as FIG. 4 a circuit diagram for the design of an embodiment having two delay lines for delaying two signal currents. The signals are supplied to the input lines 1 and 1' and are indicated in the drawing by $I_{n1}$ and $I_{n2}$, respectively. The first delay line comprises besides sublines a and b, which correspond to the sublines a and b in FIG. 4, a third subline in the lower part of the Figure provided with the reference symbol c. The sublines a and b are controlled by the parts 5a and 5b of the shift register 5. The part c is controlled by the subregister 5c connected in series with the parts 5a and 5b. The other delay line, of which corresponding parts are designated by the same reference symbols as in the first delay line, but primed, also comprises twelve memory cells, grouped in three parallel sublines a', b' and c'. The second input signal $I_2$ is supplied to the input line 1' and is read out at the output line 2'. The sublines a' and b' can be located, viewed from the sublines a and b, on the other side beside the sublines 5a and 5b of the shift register and can also be controlled by the sublines 5a and 5b. The parts a' and b' of the second delay line in principle have the same configuration as the parts a and b of the first delay line with a common centrally arranged part of the read-out line 2', the cells b' and c' on either side thereof and then the parts 5b and 5c of the shift register. The part c of the first delay line is located on the other side of the part 5c of the shift register and can be controlled thereby.

The configuration shown in FIG. 8 has, in addition to the advantage that the parasitic capacitance of the read-out lines 2 and 2' is low, the additional advantage of a saving in space because only one shift register need be used for two delay lines.

It should be appreciated that the invention is not limited to the embodiments described here, but that many further variations are possible within the scope of the invention for those skilled in the art.

I claim:

1. An integrated circuit having a delay line arranged at a surface of a semiconductor body and comprising a series of signal storage capacitances, an input line for supplying signals and a read-out line for reading out the stored signals, a plurality of pairs of transistors, which are each coupled to a signal storage capacitance and of which a transistor, designated the read-in transistor, comprises a switch between the capacitance and the read-in line, while the other transistor, designated the read-out transistor, comprises a switch between the capacitance and the read-out line, and further comprising a digital shift register having a plurality of outputs which are connected to control electrodes of the transistors, characterized in that the delay line comprises at least two adjacent parts with a common centrally-arranged part of the read-out line therebetween, the signal storage capacitances and the associated pairs of transistors and parts of the shift register being located on both sides of said parts of the read-out line in such a manner that on both sides of said part of the read-out line the signal storage capacitances with their coupled transistors of one of the parts of the delay line are located between the read-out line and the associated part of the shift register.

2. An integrated circuit as claimed in claim 1, characterized in that two read-out transistors located on both sides of the centrally arranged part of the read-out line are connected by a common contact to the centrally arranged part of the read-out line.

3. An integrated circuit as claimed in claim 1, further comprising a second delay line, whose construction is analogous to that of the first delay line and which also comprises at least two parts, which are arranged on either side of the two parts of the first delay line, said parts of the shift register being common to the first and second delay lines.

4. An integrated circuit as claimed in claim 2, further comprises a second delay line, whose construction is analogous to that of the first delay line and which also comprises at least two parts, which are arranged on either side of the two parts of the first delay line, said parts of the shift register being common to the first and second delay lines.

* * * * *